US011610881B2

(12) United States Patent
Hashiba

(10) Patent No.: US 11,610,881 B2
(45) Date of Patent: Mar. 21, 2023

(54) DETECTION DEVICE

(71) Applicant: Japan Display Inc., Tokyo (JP)

(72) Inventor: Yoshikazu Hashiba, Tokyo (JP)

(73) Assignee: Japan Display Inc., Tokyo (JP)

(*) Notice: Subject to any disclaimer, the term of this patent is extended or adjusted under 35 U.S.C. 154(b) by 99 days.

(21) Appl. No.: 17/221,408

(22) Filed: Apr. 2, 2021

(65) Prior Publication Data
US 2021/0320101 A1 Oct. 14, 2021

(30) Foreign Application Priority Data

Apr. 14, 2020 (JP) .............................. JP2020-072083

(51) Int. Cl.
| | | |
|---|---|---|
| *H01L 27/02* | (2006.01) | |
| *G06F 3/044* | (2006.01) | |
| *H01L 27/12* | (2006.01) | |
| *H02H 9/04* | (2006.01) | |
| *G06F 3/045* | (2006.01) | |
| *G06V 40/13* | (2022.01) | |

(52) U.S. Cl.
CPC .......... *H01L 27/0281* (2013.01); *G06F 3/044* (2013.01); *G06F 3/045* (2013.01); *H01L 27/0288* (2013.01); *H01L 27/0292* (2013.01); *H01L 27/1255* (2013.01); *H02H 9/046* (2013.01); *G06V 40/1306* (2022.01)

(58) Field of Classification Search
CPC ....... H01L 27/0281; G06F 3/044; G06F 3/045
See application file for complete search history.

(56) References Cited

U.S. PATENT DOCUMENTS

| | | | | |
|---|---|---|---|---|
| 10,297,619 | B2* | 5/2019 | Huang | G02F 1/13452 |
| 10,534,465 | B2* | 1/2020 | Katsuta | G06F 3/0443 |
| 2014/0210751 | A1* | 7/2014 | Okamura | G06F 3/04164 |
| | | | | 345/173 |
| 2017/0199613 | A1* | 7/2017 | Lin | G06F 3/0416 |
| 2019/0196619 | A1* | 6/2019 | Baek | G06F 3/044 |
| 2019/0265830 | A1* | 8/2019 | Chen | G06F 3/0448 |
| 2019/0332202 | A1* | 10/2019 | Huang | G06F 3/044 |
| 2020/0249053 | A1* | 8/2020 | Murata | G06F 3/044 |

FOREIGN PATENT DOCUMENTS

JP 2014179662 A 9/2014

* cited by examiner

*Primary Examiner* — Scott Bauer
(74) *Attorney, Agent, or Firm* — K&L Gates LLP

(57) ABSTRACT

A detection device comprises a substrate, a terminal part provided on the substrate and having a plurality of terminals, a first protection circuit unit provided on the substrate and having a plurality of first protection circuits, a selector unit provided on the substrate and having a plurality of selectors, a second protection circuit unit provided on the substrate and having a plurality of second protection circuits and a sensor unit provided on the substrate and having a plurality of sensors. The first protection circuit unit is provided between the terminal unit and the selector unit, and the second protection circuit unit is provided between selector unit and the sensor unit.

20 Claims, 12 Drawing Sheets

DETECTION DEVICE

CROSS-REFERENCE TO RELATED APPLICATIONS

This application is based upon and claims the benefit of priority from the prior Japanese Patent Application No. 2020-072083, filed on Apr. 14, 2020, the entire contents of which are incorporated herein by reference.

FIELD

An embodiment of the present invention relates to a detection device.

BACKGROUND

A detection device detects a touch position, a fingerprint, and the like. The detection device includes, for example, a sensor unit and a plurality of terminals. The sensor unit and the plurality of terminals are provided on glass substrate. The plurality of terminals are electrically connected to the sensor unit. For example, when a human finger comes close to the sensor unit, a control signal is input to the plurality of terminals, and a detection signal from the sensor unit is output to the plurality of terminals. The detection device can detect a touch position, a fingerprint based on the output detection signal. On the other hand, in the atmosphere, an electrostatic discharges (Electro static discharge, ESDs) may occur. A protection circuit is provided in the plurality of terminals, the sensor unit, various elements (e.g. switches, electrodes, etc.) included in the detection device. The protection circuit prevents the plurality of terminals, the sensor unit, and various elements from being destroyed by ESD.

SUMMARY

A detection device according to an embodiment according to the present invention includes a substrate, a terminal part provided on the substrate and having a plurality of terminals, a first protection circuit unit provided on the substrate and having a plurality of first protective circuits, a selection circuit section provided on the substrate and having a plurality of selection circuits, a second protection circuit unit provided on the substrate and having a plurality of second protection circuits, and a sensor unit provided on the substrate and having a plurality of sensors. The first protection circuit unit is provided between the terminal part and the selection circuit unit, and the second protection circuit unit is provided between the selection circuit section and the sensor unit.

DESCRIPTION OF EMBODIMENTS

Figure 1:
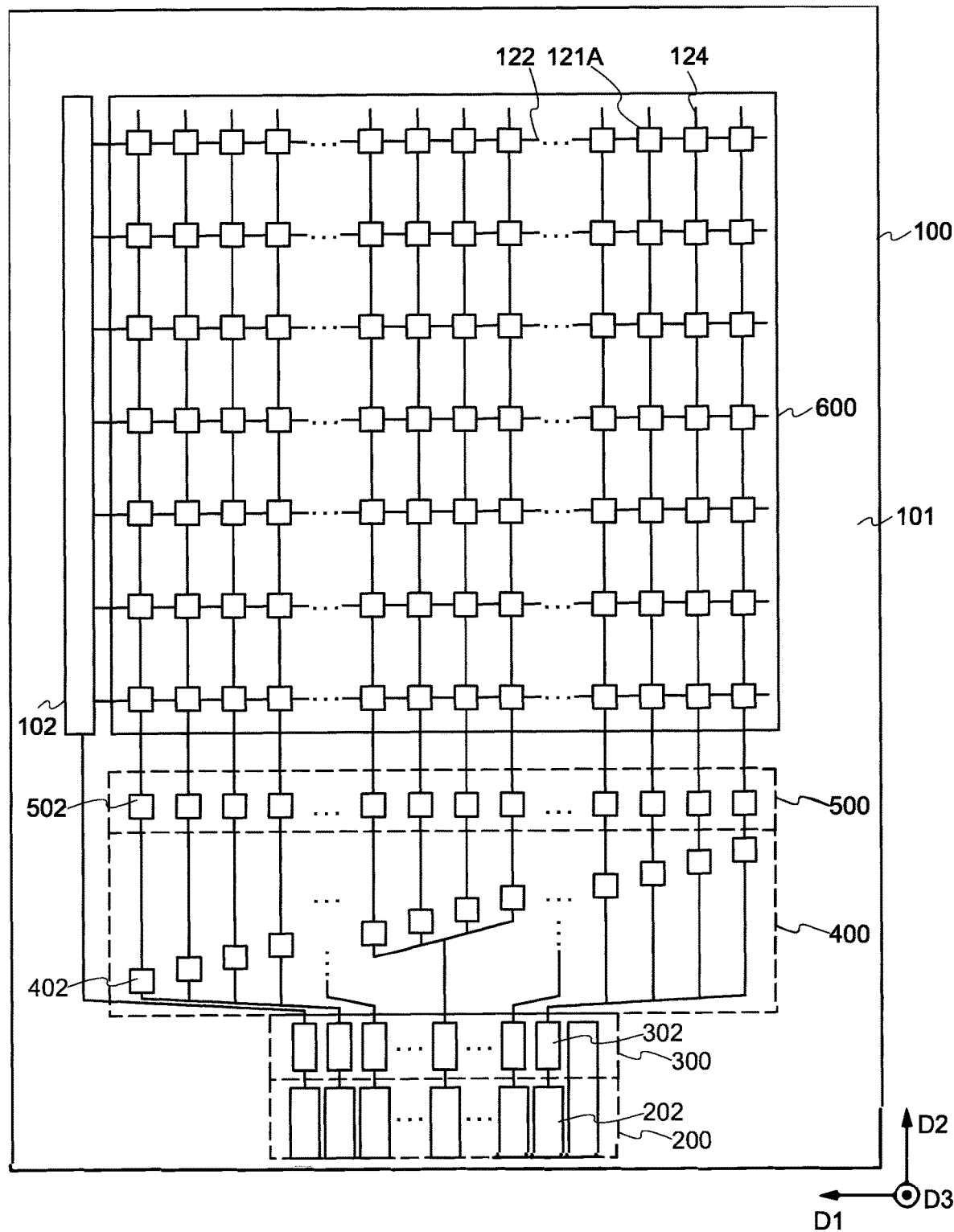
FIG. 1 is a schematic plan view showing a configuration of the detection device according to an embodiment.

Embodiments are explained below while referring to diagrams and the like. However, the present disclosure can be implemented in many different modes, and should not be interpreted as being limited to the description of the embodiments exemplified below. In addition, although the diagrams may be schematically represented with respect to each part's configurations as compared with actual embodiments in order to make explanation clearer, it is only an example and an interpretation of the present disclosure is not limited. Furthermore, in the present specification and each diagram, the same reference numerals (or reference numerals such as a, b, A, B and the like attached after a numeral) are given to the same elements as those described above with reference to the preceding diagrams, and detailed description thereof may be omitted as appropriate. The letters "first" and "second" to each element are convenient labels used to distinguish each element and have no further meaning unless otherwise explained.

In the present specification, one member or region may be "above (or below)" of another member or region. Unless otherwise limited, this includes not only the case of one member or region being directly above (or below) another member or region, but also the case of one member or region being above (or below) another member or region, that is, this also includes the case where other components is included between one member or region and above (or below) another member or region. In the following description, unless otherwise specified, in the cross sectional view, the side on which display element is arranged with respect to substrate is referred to as the "upper plane" and the opposite is referred to as the "lower plane".

The expressions "α comprises A, B or C", "α comprises any of A, B and C", "α comprises one selected from the group consisting of A, B and C", and "α comprises one selected from the group consisting of A, B and C", unless otherwise specified, do not exclude the case where α comprises multiple combinations of A to C. Furthermore, these expressions do not exclude the case where α includes other elements.

Generally, the detection device in which the sensor unit and the plurality of terminals are provided on a glass substrate does not have a path to effectively eliminate ESDs. Therefore, when the ESD enters the detection device, for example, the plurality of terminal, the sensor unit, various elements included in the detection device (e.g., switches, electrodes, etc.) are destroyed. As a result, there is a possibility that the detection device does not turn operation.

It is one of objects of the present invention to provide a detection device which suppresses destruction of various elements in the detection device due to ESD.

In some embodiments described below, a configuration for suppressing destruction of various elements in the detection device due to ESD is shown.

The detection device according to one embodiment may be, for example, a touch sensor or the display device equipped with the touch sensor capable of detecting a position where a finger is close to or touched, and may be a sensor device capable of detecting fingerprints. In the specification and claims of the present application (hereinafter referred to as the "specification and the like"), the detection device which is one of the embodiments is based on a sensor device capable of detecting a fingerprint (hereinafter referred to as a fingerprint sensor).

<1. Configuration of the Detection Device 10>

Figure 2:
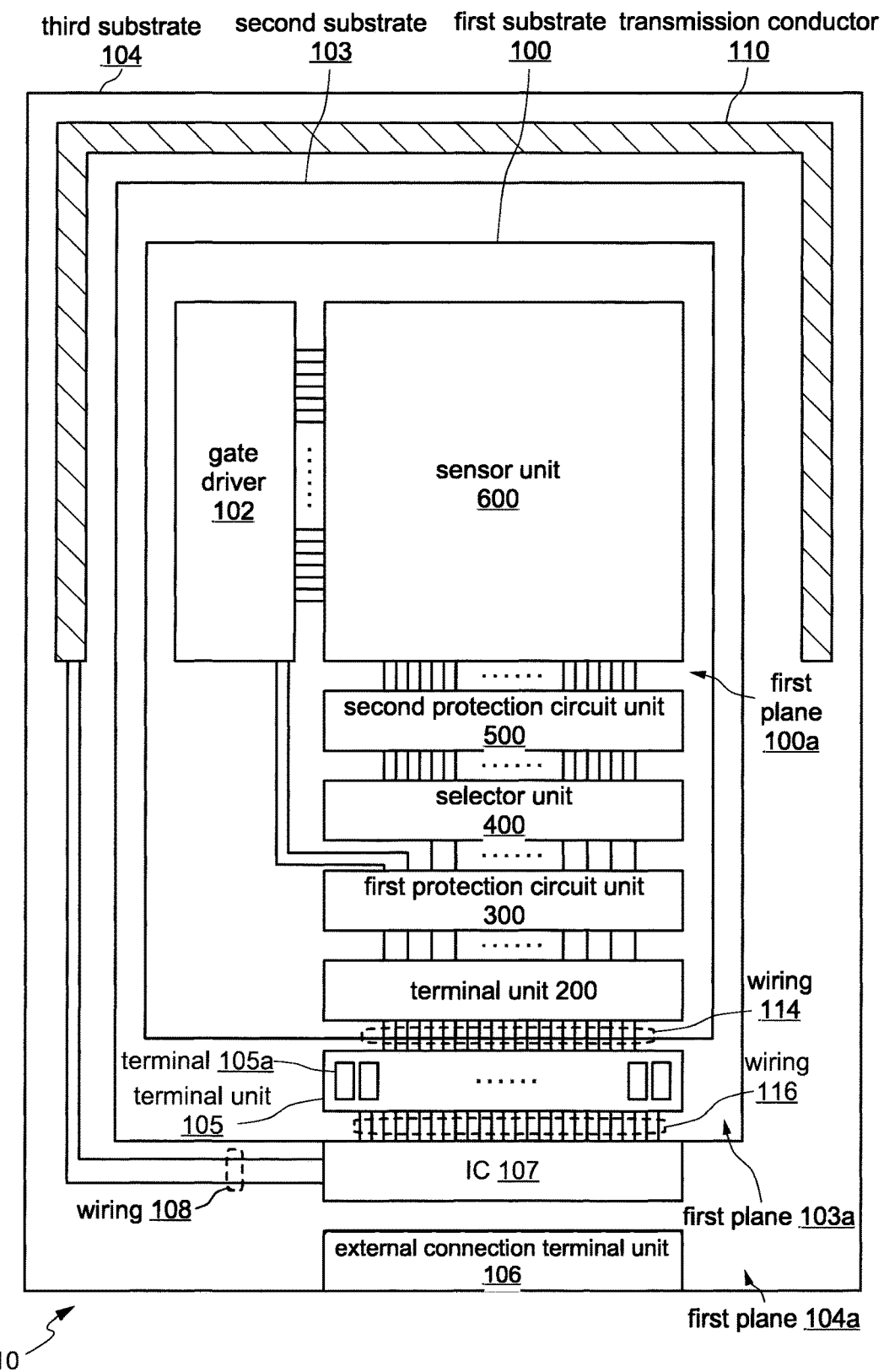
FIG. 2 is a schematic plan view showing a configuration of the detection device according to an embodiment.
Figure 3:
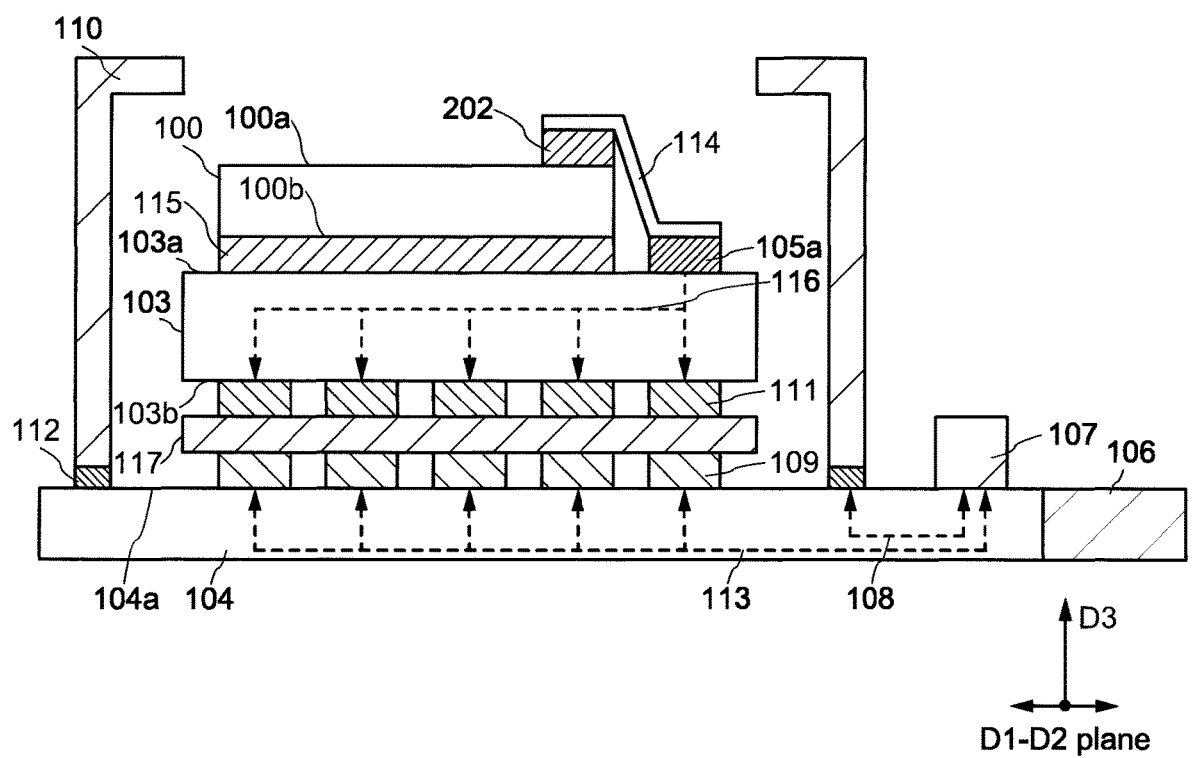
FIG. 3 is a schematic cross sectional view showing a configuration of the detection device according to an embodiment.

FIG. 1 and FIG. 2 is the schematic plan view showing the configuration of the detection device 10 according to the embodiment. FIG. 3 is the schematic cross sectional view showing a cross section of the detection device 10 according to the embodiment. The configuration of the detection device 10 shown in FIGS. 1 to 3 is an example, and the configuration of the detection device 10 is not limited to the configuration shown in FIGS. 1 to 3.

As shown in FIG. 1, the detection device 10 includes a first substrate 100, a peripheral area 101, a terminal part 200, a first protection circuit unit 300, a selection circuit section 400, a second protection circuit unit 500, and a sensor unit 600. The terminal part 200 includes a plurality of terminal 202. The first protection circuit unit 300 includes a plurality of first protection circuit 302. The selection circuit section 400 includes a plurality of selection circuit 402. The second protective circuit portion 500 includes a plurality of second protection circuit 502. The sensor unit 600 includes a plurality of sensor electrode 121A, a plurality of gate line 122, and a plurality of data line 124. The first protection circuit unit 300 is provided between the terminal part 200 and the selection circuit section 400, the second protection circuit unit 500 is provided between the selection circuit section 400 and the sensor unit 600.

As shown in FIG. 2, the detection device 10 includes the first substrate 100, the terminal part 200, the first protection circuit unit 300, the selection circuit section 400, the second protection circuit unit 500, the sensor unit 600, a gate driver 102, a second substrate 103, a third substrate 104, a terminal unit 105, an external connection terminal unit 106, a IC (integrated circuit) 107, a plurality of wiring 108, a plurality of wiring 114, and a transmission conductor 110. The terminal unit 105 includes a plurality of terminal 105a.

As shown in FIG. 3, the detection device 10 includes the first substrate 100, the terminal 202, the second substrate 103, the third substrate 104, the terminal 105a, the external connection terminal unit 106, the IC 107, the wiring 114, the transmission conductor 110, the plurality of connecting terminal 111, the wiring 116, the plurality of terminal 109, the wiring 113, the plurality of terminal 112, an adhesive layer 115, and an adhesive layer 117. The second substrate 103 includes the terminal 105a, the plurality of connecting terminal 111, and the wiring 116. The third substrate 104 has the plurality of terminal 109, the plurality of terminal 112, the external connection terminal unit 106, the wiring 113, and the plurality of wiring 108 (FIG. 2).

As shown in FIGS. 1 to 3, the transmission conductor 110, the terminal part 200, the first protection circuit unit 300, the selection circuit section 400, the second protection circuit unit 500, the sensor unit 600, and the gate driver 102 are provided on a first plane 100a of the first substrate 100. Furthermore, the transmission conductor 110, the terminal part 200, the first protection circuit unit 300, the selection circuit section 400, the second protection circuit unit 500, and the gate driver 102 is provided in the peripheral area 101.

The first substrate 100 is electrically connected to the terminal unit 105 using a plurality of wiring 114. More specifically, the first substrate 100 is adhered to the a first plane 103a of the second substrate 103 using adhesive layer 115. The wiring 114 electrically connects terminal 202 included in the first substrate 100 and terminal 105a included in the terminal unit 105.

The second substrate 103 is adhered to a first plane 104a of the third substrate 104 using the adhesive layer 117. The plurality of terminal 109 are provided on the first plane 104a of the third substrate 104. The plurality of connecting terminal 111 are provided on a second plane 103b of the second substrate 103. The wiring 116 is provided inside the second substrate 103. The wiring 116 connects the plurality of terminal 105a to the plurality of connecting terminal 111. The adhesive layer 117 adheres each of the plurality of connecting terminal 111 to each of the plurality of terminal 109 provided on the first plane 104a of the third substrate 104. One terminal 105a of the plurality of terminal 105a may be connected to one connecting terminal 111 of the plurality of connecting terminal 111, two or more terminal 105a of the plurality of terminal 105a may be connected to one connecting terminal 111 of the plurality of connecting terminal 111, and two or more terminal 105a of the plurality of terminal 105a may be connected to two or more connecting terminal 111 of the plurality of connecting terminal 111.

The terminal 109, the terminal 112, the IC (Integrated circuit) 107, and the external connection terminal portion 106 are provided on the first plane 104a of the third substrate 104. The wiring 113 passes through the interior of the third substrate 104 and connects the terminal 109 to IC (Inter circuit) 107. The plurality of wiring 108 are provided within the third substrate 104. The plurality of wiring 108 connect IC (Inter circuit) 107 to the transmission conductor 110.

The first substrate 100 includes an insulating material. For example, the first substrate 100 may be a glass substrate or a substrate having plasticity. The substrate having plasticity is, for example, substrate using polyimide, acrylic, epoxy, polyethylene terephthalate. The substrate having plasticity may be referred to as a substrate, base film, or sheet substrate. In this specification and the like, the first substrate 100 is illustratively a glass substrate.

The second substrate 103 includes the insulating material. The second substrate 103 may be, for example, a rigid substrate. The second substrate 103 is specifically a printed circuit board (PCBs). The second substrate 103 is thicker and stiffer than the third substrate 104.

The third substrate 104 includes an insulating material. The third substrate 104 may be, for example, a flexible printed circuit (FPC) substrate. The third substrate 104 is thinner and more flexible than the second substrate 103.

The second substrate 103 may be an FPC circuit substrate, and the third substrate 104 may be a PCB circuit. For example, the second surface 100b of the first substrate 100 may be adhered to the first plane 104a of the third substrate 104, at least a portion of the plurality of terminal 202 may be connected to at least a portion of the plurality of terminal 109 by the wiring 114, another portion of terminal 202 may be connected to the plurality of terminal 105a by another FPC circuit substrate, and at least a portion of the plurality of connecting terminal 111 may be connected to at least a portion of the plurality of terminal 109 by another FPC circuit substrate.

The terminal 105a, the connecting terminal 111, the terminal 109, the terminal 112, the wiring 116, the wiring 113, and the wiring 108 are formed of, for example, metallic materials. The metal material is, for example, copper (Cu).

The adhesive layer 115 and the adhesive layer 117 include insulating materials. For example, an anisotropic conductive film (ACF) and an anisotropic conductive pastes (ACP) can be used as the adhesive layer 115 and the adhesive layer 117.

As the wiring 114, for example, a gold (Au) wire or a platinum (Pt) wire can be used. The wiring 114 is connected to the terminal 202 and the terminal 105a using a wire bonding technique.

The external connection terminal unit 106 include a plurality of terminal (not shown). By using FPC substrate to connect the external connection terminal unit 106 to a externally located device the detection device 10 can input and output signals to and from the externally located device. For example, if the externally located device is a display device, the display device may display fingerprints based on signals detected using the detection device 10.

In the first substrate 100, the wiring 114 and the first plane 103a of the second substrate 103, the portions exposed from the adhesive layer 115 may be covered with an organic resin material or a coating layer. The organic resin material is, for example, a thermosetting resin containing an epoxy resin as a main component. By covering the first substrate 100 or the like with the organic resin material or the coating layer, it is possible to prevent the sensor electrode 121A from being damaged from the outside of the detection device 10.

In the fingerprint sensor according to an embodiment, the transmission conductor 110 serves as a transmitting electrode (Tx electrode), the sensor electrode 121 serves as a receiving electrode (Rx electrode). For example, a driving signal Vsig (FIG. 12) or a power supply is supplied from IC (Integrated circuit) 107 to the sensor unit 600 and the transmission conductor 110. When the finger contacts the detection device 10, the electric field between the transmission conductor 110 and the sensor electrode 121 changes. The sensor electrode 121 detects (inputs) the change in driving signal Vsig based on the variation electric field. The sensor electrode 121 transmits (outputs) a detection signal Vdet (FIG. 12) to the IC 107 via the data line 124. At this time, the detection signal Vdet includes the detected change in the driving signal Vsig. The IC 107 can detect fingerprints by receiving the detection signal Vdet and analyzing the detection signal Vdet.

In the conventional detection device including the sensor unit and a plurality of terminal on glass substrate, one protective circuit is provided between the terminal and the sensor unit. In contrast, in the detection device 10 according to an embodiment, the first protection circuit unit 300 is provided between the terminal part 200 and the selection circuit section 400. As a result, the sensor unit 600 suppresses the ESD entering the first protection circuit unit 300 and the selection circuit section 400 from the side of the terminal part 200. In the detection device 10 according to an embodiment, the second protection circuit unit 500 is provided between the selection circuit section 400 and the sensor unit 600. As a result, the second protection circuit unit 500 suppresses the ESD entering the selection circuit section 400 from the side of the sensor unit 600. Therefore, in the detection device 10 according to the embodiment, by providing protection circuits in at least two places, ESD entering from different paths can be suppressed, and destruction of various elements in the detection device 10 due to ESD can be suppressed more effectively. As a result, the detection device 10 according to the embodiment can suppress destruction of various elements, and thus can accurately detect, for example, fingerprints.

The detection device 10 according to an embodiment may have a metal wiring extending from the terminal part 200 and surrounding the four sides of the sensor section 600 and disposed within the sensor section 600. Consequently, the detection device 10 according to an embodiment can discharge ESDs generated in the atmosphere at the first stage with the metal wiring, and at the second stage with the first protection circuit 302 and the second protection circuit 502.

<2. Configuration of the Sensor Unit 600 from the Terminal Part 200>

Figure 4:
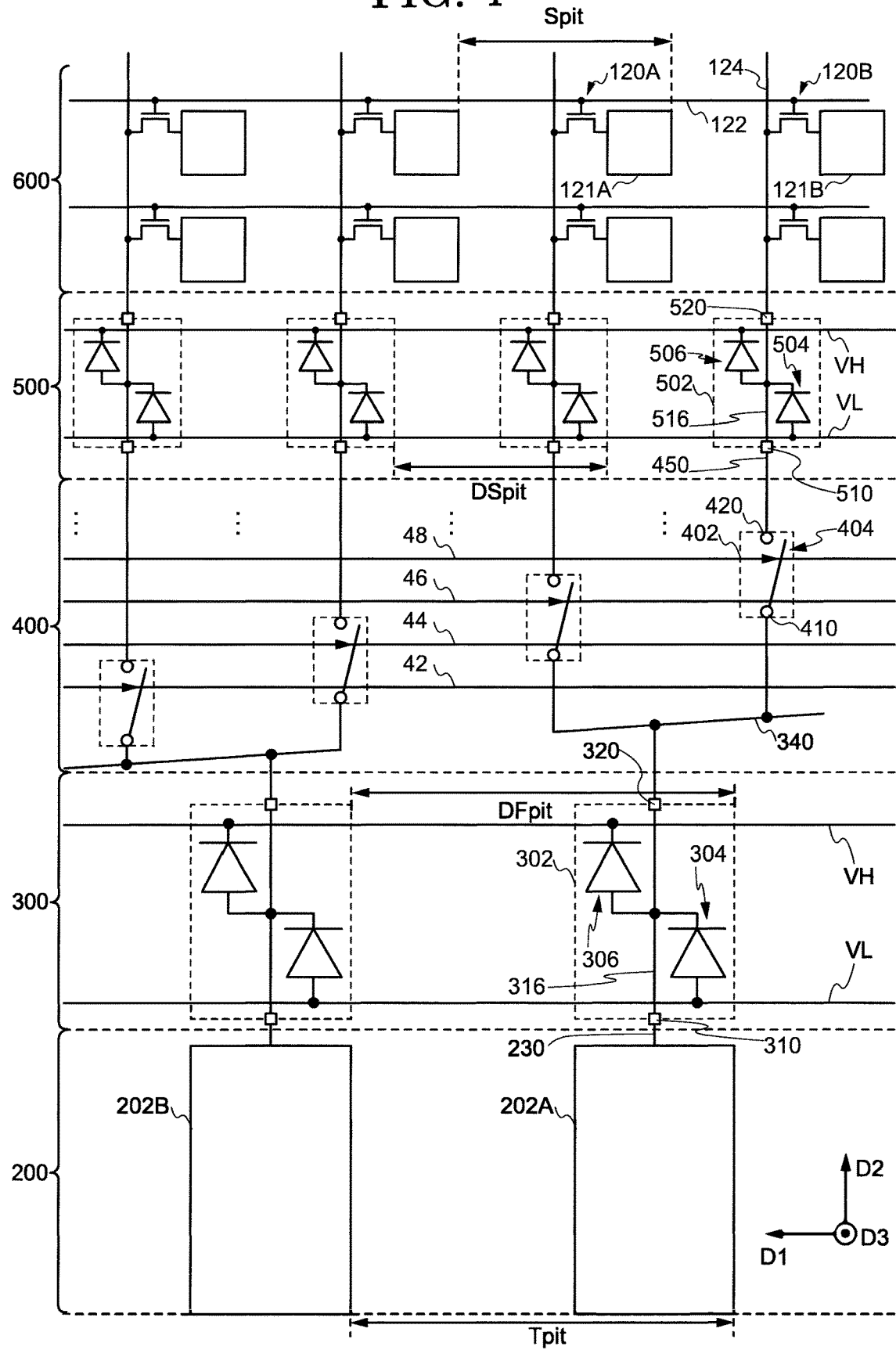
FIG. 4 is a schematic plan view showing a configuration of the detection device according to an embodiment.

FIG. 4 is a schematic plan view showing the configuration of the sensor unit 600 from the terminal part 200 included in the detection device 10 according to an embodiment. The configuration of the detection device 10 shown in FIGS. 1 to 4 is an example, and the configuration of the detection device 10 is not limited to the configuration shown in FIGS. 1 to 4. The description of same or similar components as those of FIGS. 1 to 3 will be omitted.

The terminal part 200 include a plurality of the terminal 202. The plurality of terminal 202 includes a terminal 202A and a terminal 202B. Each of the plurality of terminal 202 electrically connects to each of the plurality of wiring 230. A plurality of terminal 202, for example, inputs a signal or a power supply voltage supplied from the IC 107. Such a signal or a power supply voltage to be input to the plurality of terminal 202 is supplied to the gate driver 102 via, for example, wiring. The signal and the power supply voltage are, for example, a signal and a power supply voltage for turning operation the sensor unit 600 or the transmission conductor 110. The signal and the power supply voltage are, for example, a control signal for controlling the gate driver 102, the driving signal Vsig for detecting fingerprints, and the power supply voltage for driving the gate driver 102. The number of terminal 202 may be any number as long as it is plural. The number of terminal 202 is appropriately determined according to the application and specifications of the detection device 10.

The first protection circuit unit 300 includes a plurality of first protective circuit 302. The first protection circuit 302 has an input terminal 310, a first rectifying element 304, a second rectifying element 306, a wiring 316, and an output terminal 320. The wiring 316 of the first protection circuit 302 is connected to the terminal 202A by the input terminal 310.

The first rectifying element 304 is provided between the wiring 316 and the low voltage line VL. The first rectifying element 304 suppresses the current flowing in the direction of the low voltage line VL from the wiring 316. That is, when a voltage higher than the voltage supplied to the low voltage line VL is supplied to the wiring 316, the first rectifying element 304 does not flow current from the wiring 316 in the direction of the low voltage line VL, and when a voltage lower than the voltage supplied to the low voltage line VL is supplied to wiring 316, the first rectifying element 304 flows current from the low voltage line VL to the wiring 316.

The second rectifying element 306 is provided between the high voltage line VH and the wiring 316. The second rectifying element 306 suppresses the current flowing in the direction of the wiring 316 from the high voltage line VH. That is, when a voltage lower than the voltage supplied to the high voltage line VH is supplied to the wiring 316, the second rectifying element 306 does not flow a current in the direction of the high voltage line VH from the wiring 316, and when a voltage higher than the voltage supplied to the high voltage line VH is supplied to the wiring 316, the second rectifying element 306 flows a current to the high voltage line VH from the wiring 316.

In this specification and the like, the voltage supplied to the high voltage line VH is a voltage higher than the voltage supplied to the low voltage line VL. Voltage supplied to the high voltage line VH is, for example, VDD, the voltage supplied to the low voltage line VL is, for example, VSS or GND.

The first protection circuit 302, when a voltage lower than the voltage supplied to the low voltage line VL is supplied to terminal 202, the first rectifying element 304 flows a current from the low voltage line VL in the direction of the wiring 316. That is, the first protection circuit 302 can raise ESD of a voltage lower than the voltage supplied to the low voltage line VL up to the voltage supplied to the low voltage line VL. The first protection circuit 302, when a voltage higher than the voltage supplied to the high voltage line VH is supplied to the terminal 202, the second rectifying element 306 flows a current from the high voltage line VH in the direction of the wiring 316. That is, the first protection circuit 302 can reduce the ESD of a voltage higher than the voltage supplied to the high voltage line VH to the voltage supplied to the high voltage line VH. Therefore, the first protection circuit 302 can protect the elements constituting the selection circuit 402 and the sensor unit 600 from ESDs.

Here, for convenience of explanation, the low voltage line VL is exemplified for supplying one potential. The actual low voltage power supply line VL provides at least two potentials. Therefore, the detection device 10 according to an embodiment has a first low voltage power supply line VL1, and a second low voltage power supply line VL2. For example, the voltage supplied to the first low voltage power supply line VL1 is VSS, and the voltage supplied to the second low voltage power supply line VL2 is GND. Whether to connect the first rectifying element 304 to any of the first low-voltage power supply line VL1 and the second low-voltage power supply line VL2 is predetermined by the amplitude of the signal to be input to the terminal 202, and is laid out.

The selection circuit section 400 has a plurality of selection circuit 402. A portion of the plurality of selection circuit 402 is electrically connected to one first protection circuit 302. For example, four selection circuits 402 are electrically connected to one first protection circuit 302 (FIG. 1). The wiring 340 connects the output terminal 320 to the input terminal 410 of each of the four selection circuits 402. In FIG. 4, focusing on one of the selection circuit 402 of the four selection circuits 402. The selection circuit 402 is, for example, a switch 404 having an input terminal 410 and an output terminal 420. For example, a plurality of selection signals, such as the selection signal 42, the selection signal 44, the selection signal 46, and the selection signal 48 or the like, is supplied from IC 107. When the on signal supplied to the selection signal 48, the switch 404 conducts the output terminal 420 and the input terminal 410. The on signal is a signal that provides a voltage that conducts the input terminal 410 and output 420. For example, the on signal may be High or low. A wiring 340 connects the output terminal 320 of the first protection circuit 302 to the input terminal 410 of the selection circuit 402. Since the output terminal 320 is connected to the wiring 316, the wiring 340 is connected to the wiring 316. The wiring 340 may be the same as the wiring 316, and the wiring 340 may be connected to the wiring 316 through a connecting point such as a contact hole in a manufacturing process. Of the plurality of selection circuits 402, selection circuits 402 in which the same selection signal is supplied from IC 107 conducts the output terminal 420 and the input terminal 410 at the same time. The selection circuit 402 is selected by the selection signal 48. The selection circuit 402 supplies a driving signal supplied to the terminal 202 to the sensor 120B electrically connected to the selection circuit 402.

The second protection circuit unit 500 includes a plurality of second protection circuit 502. The second protection circuit 502 has an input terminal 510, a third rectifying element 504, a fourth rectifying element 506, a wiring 516, and an output terminal 520. The wiring 450 connects the output terminal 420 of the switch 404 to the input terminal 510 of the second protection circuit 502. The wiring 516 of the second protection circuit 502 is connected with the output terminal 420 of the switch 404 using the input terminal 510. Since the input terminal 510 is connected to the wiring 516, the wiring 450 is connected to the wiring 516. The wiring 450 may be the same as the wiring 516, and the wiring 450 may be connected to the wiring 516 through a connecting point such as a contact hole in a manufacturing process.

A third rectifying element 504 is provided between the wiring 516 and the low voltage line VL. The third rectifying element 504 suppresses the current flowing in the direction of the low voltage line VL from the wiring 516. That is, when a voltage higher than the voltage supplied to the low voltage line VL is supplied to the wiring 516, the third rectifying element 504 does not flow current from the wiring 516 in the direction of the low voltage line VL, and when a voltage lower than the voltage supplied to the low voltage line VL is supplied to the wiring 516, the third rectifying element 504 flows current from the low voltage line VL in the direction of the wiring 516. Therefore, the second protection circuit 502 can increase the ESD of a voltage lower than the voltage supplied to the low voltage line VL up to the voltage supplied to the low voltage line VL.

The fourth rectifying element 506 is provided between the high voltage line VH and the wiring 516. The fourth rectifying element 506 suppresses the current flowing in the direction of the wiring 516 from the high voltage line VH. That is, when a voltage lower than the voltage supplied to the high voltage line VH is supplied to the wiring 516, the fourth rectifying device 506 does not flow a current in the direction of the high voltage line VH from the wiring 516, and when a voltage higher than the voltage supplied to the high voltage line VH is supplied to the wiring 516, the fourth rectifying element 506 flows a current in the direction of the high voltage line VH from the wiring 516. Therefore, the second protection circuit 502 can reduce the ESD of a voltage higher than the voltage supplied to the high voltage line VH to the voltage supplied to the high voltage line VH.

Therefore, the second protection circuit 502, with respect to the second protection circuit 502, it is possible to suppress ESDs entering the elements provided on the opposite side to the sensor unit 600. Thus, the second protection circuit 502 can protect the selection circuit 402 and the terminal 202 from ESDs.

The sensor unit 600 includes a plurality of sensor 120. The plurality of sensor 120 is arranged in a matrix in a second direction (D2) intersecting the first direction (D1). Each of the plurality of sensor 120 has at least one transistor and one sensor electrode 121. The transistor has a gate electrode, a first electrode, and a second electrode. Of the first electrode and the second electrode, one is the source electrode, the other is drain electrode. The gate electrode connects to the gate line 122, the first electrode electrically connects to the data line 124, and the second electrode electrically connects to the sensor electrode 121. The data line 124 connects to the output terminal 520 of the second protection circuit 502.

The sensor 120 may have two transistors and one sensor electrode 121. At this time, the two transistors have different polarities. For example, one is an n-type transistor and the other is a p-type transistor. The gate electrode of each of the two transistors may be connected to the same gate line 122, first electrodes of the two transistors and sensor electrode 121 may be electrically connected, the second electrode of one transistor may be connected to a data line, and the second electrode of the other transistor may be connected to a common potential line. The common potential line is a wiring for supplying a common potential to the plurality of sensor 120 in common. The potential supplied to the common potential line is a reference potential such as GND, VSS, or 0V.

A second protection circuit 502 is provided between the sensor unit 600 and the selection circuit section 400. Therefore, the second protection circuit 502 can also suppress ESDs that penetrate through the first protection circuit 302 and the selection circuit 402 from the terminal 202. Thus, the second protection circuit 502 can protect the sensor unit 600 from ESDs.

Although described later in detail, a plurality of terminal 202, a plurality of the first protection circuit 302, a plurality of the second protection circuit 502 is arranged in a direction parallel or substantially parallel to the first direction (D1). With respect to a direction parallel or substantially parallel to the first direction (D1), an interval Tpit of the terminal 202A and the terminal 202B is the same or substantially the same as an interval DFpit of the first protection circuit 302 which adjoin each other. With respect to a direction parallel or substantially parallel to the first direction (D1), an interval DFpit of the first protection circuit 302 adjacent to each other is longer than an interval DSpit of the second protection circuit 502 adjacent to each other. Further, in a direction parallel or substantially parallel to the second direction (D2), the length of the first protection circuit 302 is longer than the length of the second protection circuit 502. The number of the first protection circuit 302 is equal to the number of the terminal 202, and the number of the second protection circuit 502 is equal to the number of the data line 124. The first protection circuit 302 is provided on one wiring path from one terminal 202 to the data line 124 through the selection circuit 402. The first protection circuit 302 is provided on a wiring path between the terminal 202 and a selection path. The second protection circuit 502 is provided on a wiring path between the selection circuit 402 and the data line 124.

<3. Protection Circuit Configuration>

Figure 5:
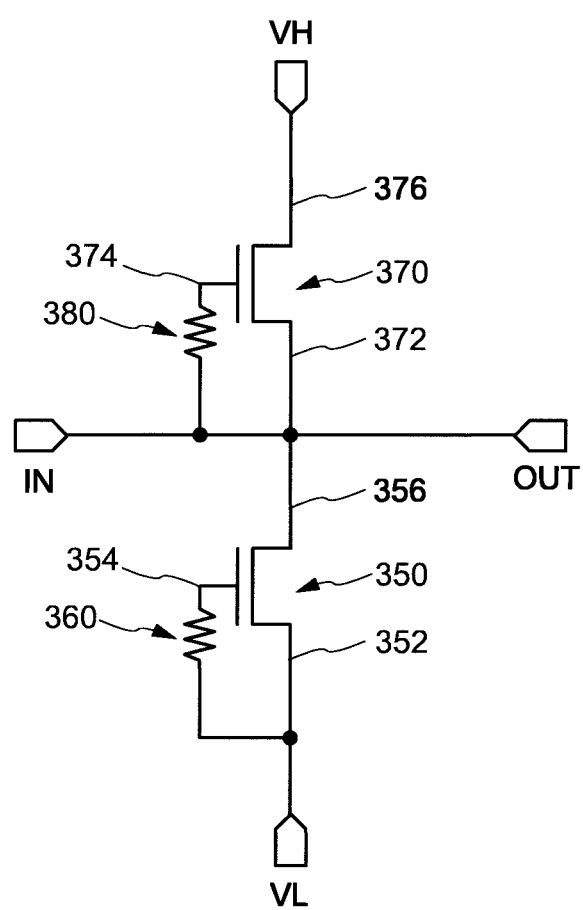
FIG. 5 is a circuit diagram showing an exemplary circuit configuration of a protection circuit according to an embodiment.

FIG. 5 is a circuit diagram illustrating a circuit configuration of a protective circuit according to an embodiment. The configuration of protective circuit shown in FIG. 5 is an example. The configuration of protective circuit according to an embodiment is not limited to the configuration shown in FIG. 5. The same or similar components as those of FIGS. 1 to 4 will not be described here.

As shown in FIG. 5, a protective circuit has an input terminal IN, an output terminal OUT, a first transistor 350, a first resistance element 360, a second transistor 370, and a second resistance element 380. The first transistor 350 has a gate electrode 354, a first electrode 352, and a second electrode 356. One of the first electrode 352 and the second electrode 356 is a source electrode, the other is drain electrode. Depending on the voltage applied to the first electrode 352 and the second electrode 356, the functions of each electrode as a source and a drain may be exchanged. The second transistor 370 has a gate electrode 374, a first electrode 372, and a second electrode 376. Similar to the first transistor 350 in the second transistor 370, one of the first electrode 372 and the second electrode 376 is a source electrode, the other is drain electrode. Depending on the voltage applied to the first electrode 372 and the second electrode 376, the functions of each electrode as a source and a drain may be exchanged.

The first resistance element 360 connects between the low voltage line VL and the gate electrode 354 of the first transistor 350. The second resistance element 380 connects between the input terminal IN and the gate electrode 374 of the second transistor 370. The first electrode 352 of the first transistor 350 connects to the low voltage line VL. The second electrode 350 of the first transistor 356 connects to the input terminal IN, the first electrode 372 of the second transistor 370, and the output terminal OUT. The second electrode 376 of the second transistor 370 connects to the high voltage line VH.

The construction of protective circuit shown in FIG. 5 is applied to the first protection circuit 302 and the second protection circuit 502 according to an embodiment. Specifically, the first rectifying element 304 and the third rectifying element 504 is constituted by a first transistor 350 which is diode-connected via a first resistance element 360. The second rectifying element 306 and the fourth rectifying element 506 is constituted by a second transistor 370 which is diode-connected via a second resistance element 380. Here, diode connection refers to a connection in which a transistor is equivalent to a diode. Specifically, it refers to short-circuiting gate electrode and drain electrode of the transistor.

The detection device 10 according to an embodiment has the first protection circuit 302 between the terminal 202 and the selection circuit 402, and the second protection circuit 502 between the selection circuit 402 and the sensor unit 600. That is, the detection device 10 according to an embodiment has two protection circuits at different positions, it is possible to suppress both the ESD intruding from the side of the terminal and the ESD intruding from the side of the sensor unit 600.

<4. Configuration of the First Protection Circuit 302 and the Second Protection Circuit 502>

Figure 6:
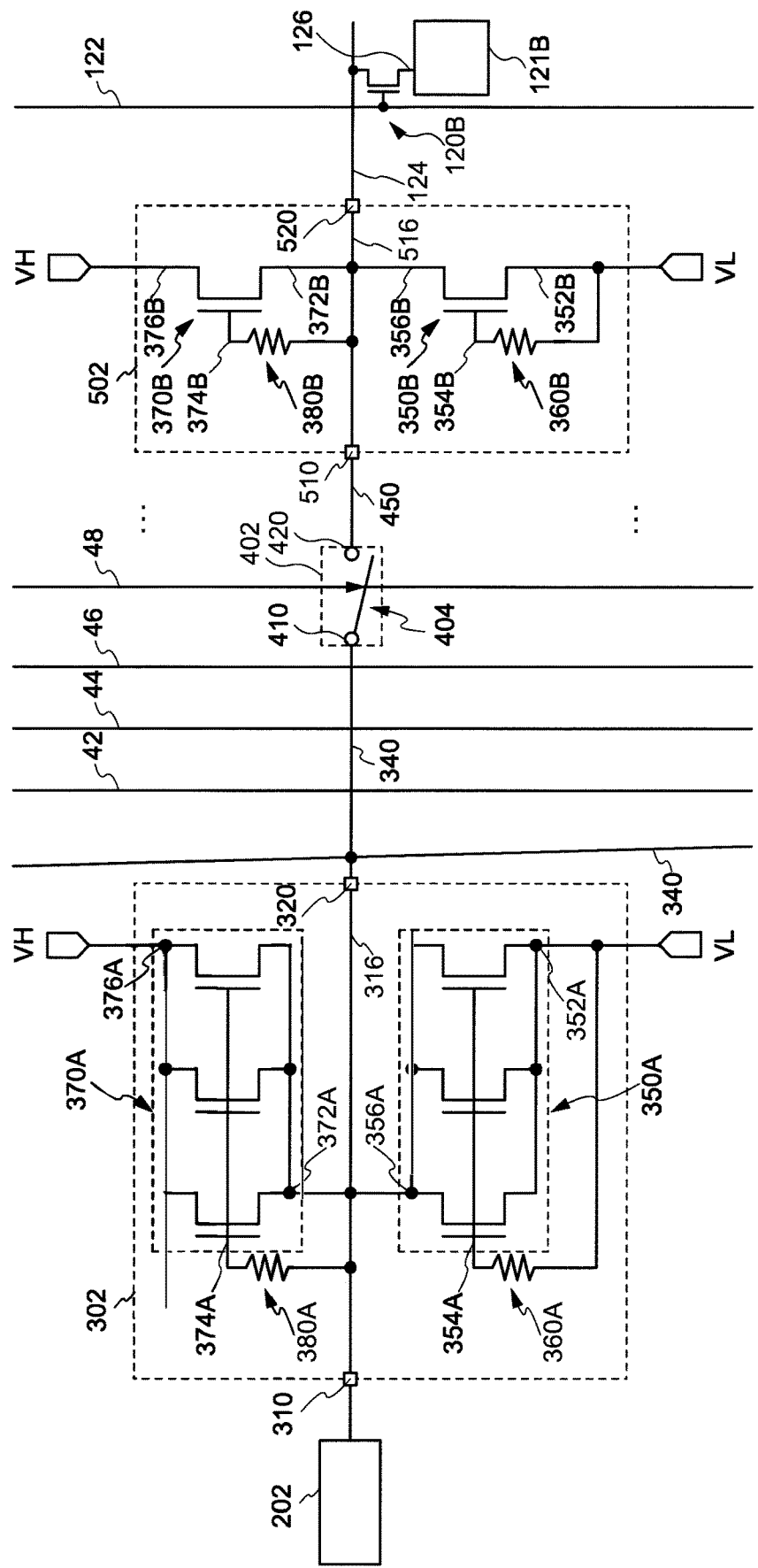
FIG. 6 is a schematic plan view showing a configuration of the detection device according to an embodiment.

In the configuration of the sensor unit 600 from terminal part 200 included in the detection device 10 according to the embodiment shown in FIG. 2, FIG. 6 is a circuit diagram showing an exemplary circuit configuration of the first protection circuit 302 and the second protection circuit 502. The configuration of the detection device 10 shown in FIG. 6 is only an example, and the configuration of the detection device 10 is not limited to the configuration shown in FIG. 6. The same or similar components as those of FIGS. 1 to 5 will not be described here.

The terminal 202, the connection between the terminal 202 and the first protection circuit 302, the connection between the first protection circuit 302 and the selection circuit, and the configuration related to the sensor 120B from the selection circuit 402 are the same as those shown in FIG. 2, and therefore, descriptions thereof are omitted here.

The first protection circuit 302 can apply the circuit configuration of protection circuit of FIG. 5. Specifically, as shown in FIG. 6, the first transistor 350A includes an input terminal 310, an output terminal 320, a first resistance element 360A, a second transistor 370A, and a second resistance element 380A. The first transistor 350A and the second transistor 370A have a configuration in which three transistors having the same or substantially the same channel width are connected in series. In the three transistors, the channel lengths are the same or substantially the same. The gate electrode 354A of the first transistor 350A and the first electrodes 352A are diode-connected via a first resistance element 360A. The gate electrode 374A of the second transistor 370A and the first electrodes 372A are diode-connected via a second resistance element 380A. The number of transistors is not limited to three.

The first resistance element 360A is connected between the low voltage line VL and the gate electrode 354A. The second resistance element 380A is connected between the input terminal 310 and the input gate electrode 374A. The first electrodes 352A are connected to the low voltage line VL. The second electrode 356A is connected to the input terminal 310, the first electrode 372A, the wiring 316, and the output terminal 320. The second electrodes 376A are connected to the high voltage line VH.

The second protection circuit 502 can apply the circuit configuration of protection circuit of FIG. 5, similar to the first protection circuit 302. Specifically, as shown in FIG. 6, an input terminal 510, an output resistance 520, a first transistor 350B, a first resistance element 360B, a second transistor 370B, and a second OOC element 380B. The first transistor 350B and the second transistor 370B have the same or substantially the same channel width. The first transistor 350B and the second transistor 370B have the same or substantially the same channel length. The gate electrode 354B and the first electrode 352B of the first transistor 350B, via the first resistance element 360B, is diode-connected. The gate electrode 374B and the first electrode 372B of the second transistor 370B is diode-connected via the second resistance element 380B.

The first resistance element 360B connects between the low voltage line VL and the gate electrode 354B. The second resistance element 380B connects between the input terminal 510 and the gate electrode 374B. The first electrode 352B connects to the low voltage line VL. The second electrode 356B connects to the input terminal 510, the first electrode 372B, the wiring 516, and the output 520. The second electrode 376B connects to the high voltage line VH.

The channel width of the first transistor 350A and the channel width of the second transistor 370A included in the first protection circuit 302 is longer than the channel width of the first transistor 350B and the channel width of the second transistor 370B included in the second protection circuit 502. A resistance value of the first resistance element 360A, a resistance value of the second resistance element 380A, a resistance value of the first resistance element 360B, and a resistance value of the second resistance element 380B are the same or substantially the same.

The detection device 10 according to an embodiment includes the first protection circuit 302 between the terminal 202 and the selection circuit 402, and the second protection circuit 502 between the selection circuit 402 and the sensor unit 600. It is conceivable that ESD entering the first protection circuit 302 from the terminal 202 side is mainly assumed to be static electricity accumulated during manufacturing the detection device 10, and is applied to the second protection circuit 502 over a predetermined time relatively more gently than ESD penetrating from the side of the sensor unit 600. In the detection device 10 according to the embodiment, since the channel width of the transistor of the rectifying element constituting the first protection circuit 302 is longer than the channel width of the transistor of the rectifying element constituting the second protection circuit 502, the capacitance included in the first protection circuit 302 is larger than the capacitance included in the second protection circuit 502. Therefore, since ESD intruding from the terminal 202 side is slowly applied, ESD is accumulated in a large capacitance contained in the first protection circuit 302. As a result, ESD is discharged to the high voltage line VH or the low voltage line VL over time. On the other hand, ESD entering the second protection circuit 502 from the side of the sensor unit 600 is assumed to be static electricity generated when the detection device 10 is used, and the static electricity may be applied faster than the static electricity from the side of the first protection circuit 302. Such static electricity does not need to accumulate in the capacitance in protective circuit for a long period of time, and is immediately discharged to the high voltage line VH or the low voltage line VL by the above configuration.

That is, the detection device 10 according to an embodiment has two protective circuit at different positions. It is possible to suppress both ESD intruding from the side of the terminal and ESD intruding from the side of the sensor unit 600 by using the detection device 10.

<5. Layout of the First Protection Circuit 302 and the Second Protection Circuit 502>

Figure 7:
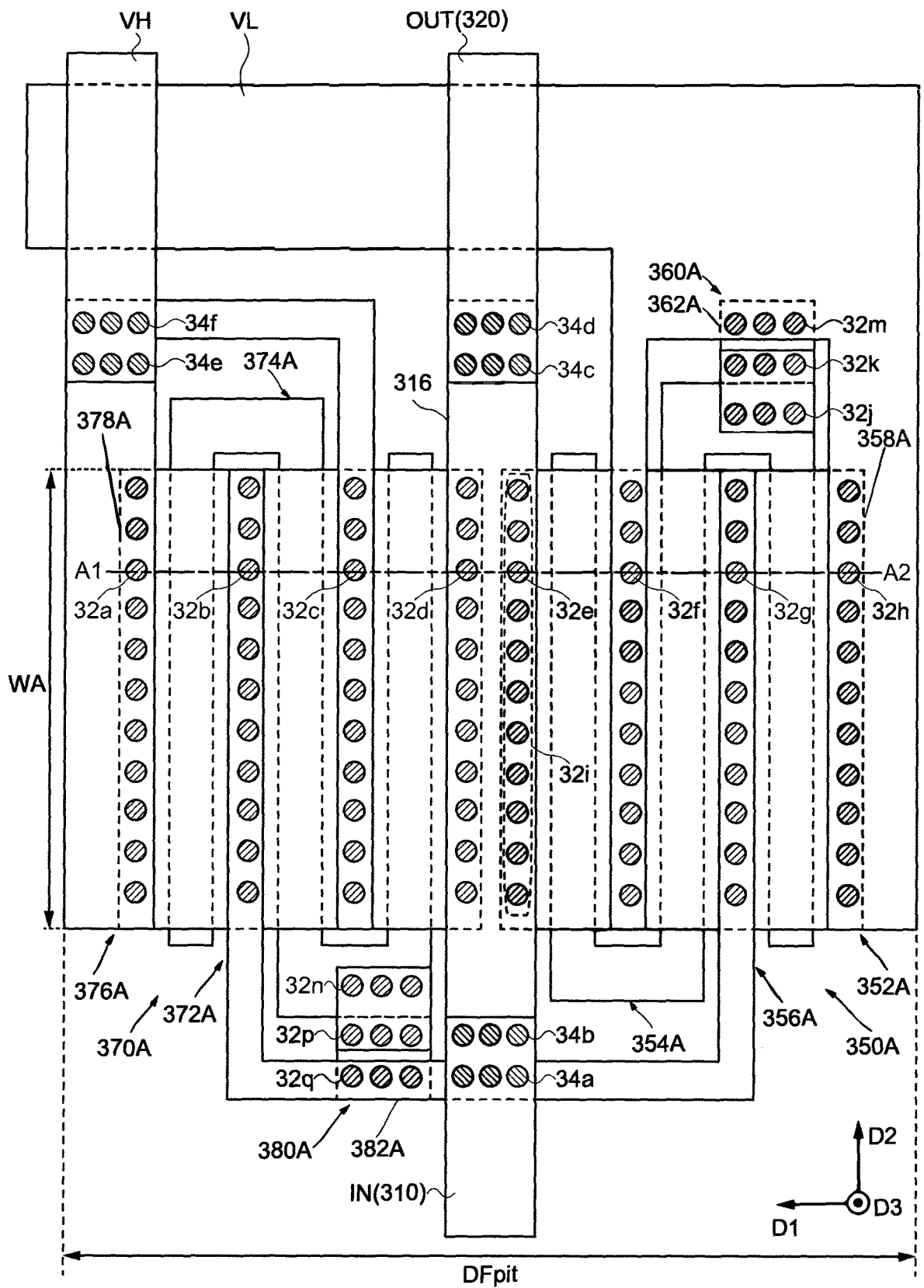
FIG. 7 is a schematic diagram showing an exemplary layout of the first protection circuit according to an embodiment.
Figure 8:
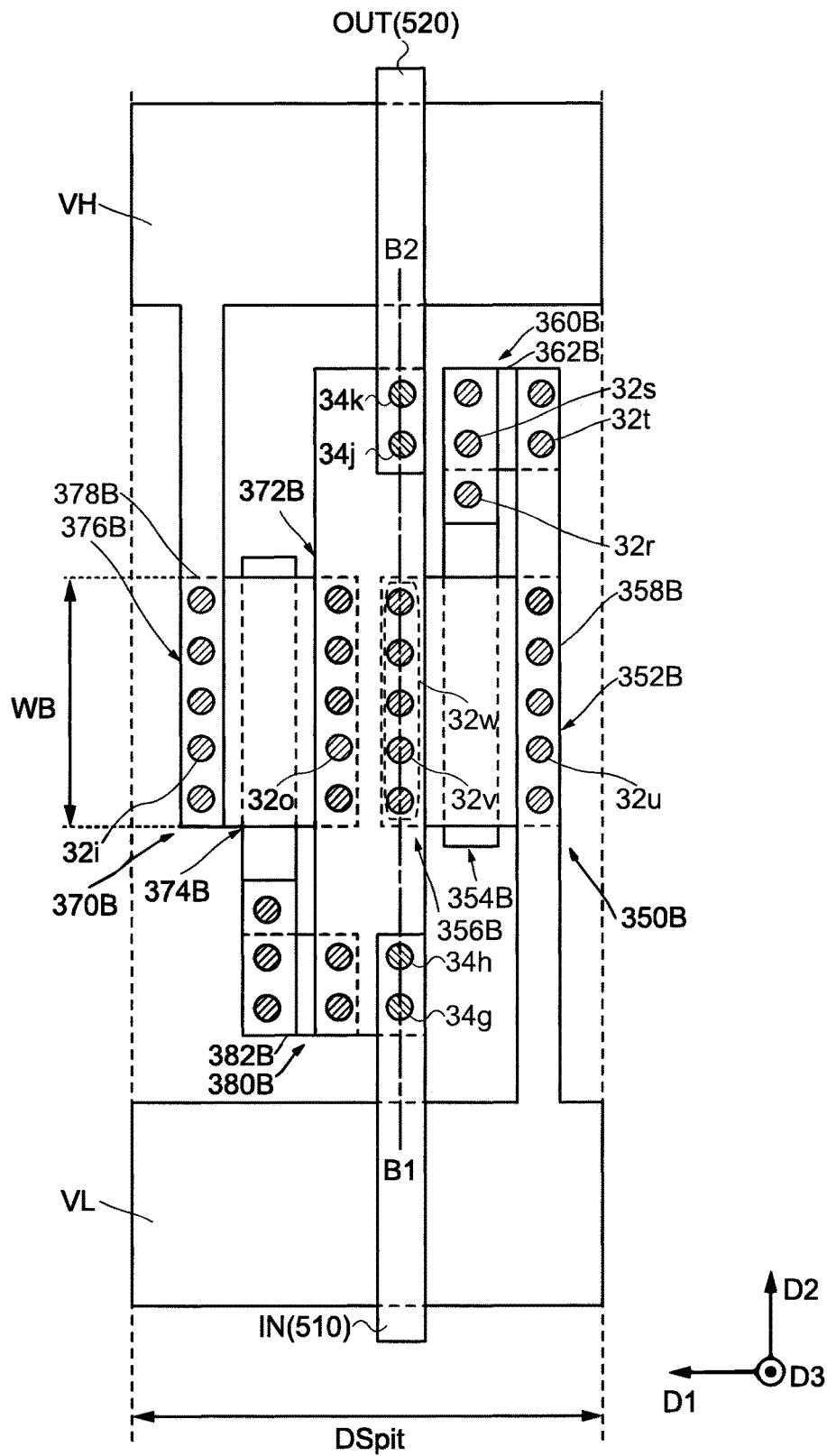
FIG. 8 is a schematic diagram showing an exemplary layout of the second protection circuit according to an embodiment.

FIG. 7 is a schematic diagram showing an exemplary layout of the first protection circuit 302 according to an embodiment. FIG. 8 is a schematic diagram showing an exemplary layout of the second protection circuit 502 according to an embodiment. The layout of the first protection circuit 302 and the layout of the second protection circuit shown in FIGS. 7 and 8 are examples, and the layout of the first protection circuit 302 and the layout of the second protection circuit are not limited to the layout shown in FIGS. 7 and 8. The description of same or similar components as those of FIGS. 1 to 6 will be omitted here.

FIG. 7 is a layout of the first protection circuit 302 shown in FIG. 5. As shown in FIG. 7, the input terminal 310 is connected to the second electrode 356A of the first transistor 350A, the first electrode 372A of the second transistor 370A, and the wiring 316 through plurality of contact holes 34a, 34b, and the like. The wiring 316 connects to the output terminal 320 via a plurality of contact holes 34c, 34d and the like. The gate electrode 354A of the first transistor 350A is connected to one end (one end of semiconductor layer 362A) of the first resistance element 360A via a plurality of contact holes 32j, 32k, and the like. The first electrodes 352A of the first transistors 350A are connected to the other ends of the first resistance elements 360A (the other end of semiconductor layer 362A) through a plurality of contact holes 32m and the like. Thus, the gate electrode 354A of the first transistor 350A and the first electrodes 352A are diode connected. The first electrodes 352A of the first transistors 350A and the other end of the first resistance elements 360A are connected to the low voltage line VL. The wiring 316 is connected to a semiconductor layer 358A through a contact hole group 32i including a contact hole 32e. The first electrodes 352A are connected to the semiconductor layer 358A through plurality of contact holes 32h, 32f, and the like. The second electrodes 356A is connected to the semiconductor layer 358A through a plurality of contact holes 32g and the like.

The gate electrode 374A of the second transistor 370A is connected to one end of the second resistance element 380A (one end of a semiconductor layer 382A) through a plurality of contact holes 32*n* and 32*p* and the like. The first electrodes 372A of the second transistor 370A are connected to the other ends of the second resistance elements 380A (the other ends of semiconductor layer 382A) via a plurality of contact holes 32*q* and the like. Thus, the first electrode 372A of the second transistor 370A is diode connected. The second electrodes 376A of the second transistor 370A are connected to the high voltage line VH through a plurality of contact holes 34*e*, 34*f*, and the like. The wiring 316 is connected to the semiconductor layer 378A via a plurality of contact holes 32*d* and the like. The first electrodes 372A are connected to a semiconductor layer 378A via plurality of contact holes 32*b* and the like. The second electrodes 376A are connected to the semiconductor layer 378A through plurality of contact holes 32*a* and the like.

The channel width of one of the first transistor 350A and the second transistor 370A is the channel width WA. Since each of the first transistor 350A and the second transistor 370A includes three transistors, the channel width of each of the first transistor 350A and the second transistor 370A is 3×WA. The channel widths of the first transistor 350A and the second transistor 370A are provided in parallel or substantially parallel to the second direction (D2), and the channel lengths of the first transistor 350A and the second transistor 370A are provided in parallel or substantially parallel to the first direction (D1). The direction from the first electrode 352A to the second electrode 356A of the first transistor 350A and the direction from the first electrode 372A to the second electrode 376A of the second transistor 370A are both parallel and substantially parallel to the first direction (D1). Therefore, in the first transistor 350A and the second transistor 370A, the direction in which current flows is parallel to or substantially parallel to the first direction.

The direction from one end to the other end of the first resistance element 360A and the direction from one end to the other end of the second resistance element 380A are parallel or substantially parallel to the second direction D2. That is, in the first resistance element 360A and the second resistance element 380A, the direction in which the current flows is parallel or substantially parallel to the second direction.

As described above, the arrangement of the first transistor 350A and the second transistor 370A is rotated by 90 degrees or approximately 90 degrees with respect to the arrangement of the first resistance element 360A and the second resistance element 380A. The direction in which current flows in the first transistor 350A and the second transistor 370A and the direction in which current flows in the first resistance element 360A and the second resistance element 380A intersect vertically or substantially vertically.

FIG. 8 is a layout of the second protection circuit 502 shown in FIG. 5. As shown in FIG. 8, the input terminal 510 connects to the second electrode 356B of the first transistor 350B, the first electrode 372B of the second transistor 370B, and the wiring 516 via a plurality of contact holes 34*g* and 34*h* or the like. The wiring 516 connects to the output terminal 520 via a plurality of contact holes 34*j* and 34*k* or the like. The gate electrode 354B of the first transistor 350B is connected to one end of the first resistance elements 360B (one end of the semiconductor layer 362B) via a plurality of contact holes 32*r* and 32*s* or the like. Further, the first electrode 352B of the first transistor 350B is connected to the other end of the first resistance element 360B (the other end of the semiconductor layer 362B) via a plurality of contact holes 32*t* or the like. Thus, the gate electrode 354B of the first transistor 350B and the first electrode 352B is diode connected. The first electrode 352B of the first transistor 350B and the other end of the first resistance element 360B is connected to the low voltage line VL. The wiring 516 and the first electrode 352B is connected to the semiconductor layer 358B via the contact hole group 32*w* including a contact hole 32*v*. The second electrode 356B is connected to the semiconductor layer 358B via a plurality of contact holes 32*u* or the like.

The gate electrode 374B of the second transistor 370B is connected to one end of the second resistance element 380B (one end of semiconductor layer 382B) via a plurality of contact holes 32*x* and 32*y*, etc. The first electrode 372B of the second transistor 370B is connected to the other end of the second resistance element 380B (the other end of semiconductor layer 382B) via a plurality of contact holes 32*z* or the like. Thus, the first electrode 372B of the second transistor 370B is diode connected. The second electrode 376B of the second transistor 370B is connected to the high voltage line VH. The wiring 516 and the first electrode 372B is connected to the semiconductor layer 378B via a plurality of contact holes 32*o* or the like. The second electrode 376B is connected to semiconductor layer 378B via a plurality of contact holes 32*o* or the like.

The channel width of the transistor of the first transistor 350B and the channel width of the second transistor 370B are the channel width WB. The channel width of the first transistor 350B and the channel width of the second transistor 370B are provided parallel or substantially parallel to the second direction (D2), the channel length of the first transistor 350B and the channel length of the second transistor 370B are provided parallel or substantially parallel to the first direction (D1). The direction from the first electrode 352B of the first transistor 350B toward the second electrode 356B and the direction from the first electrode 372B of the second transistor 370B toward the second electrode 376B are both parallel and substantially parallel to the first direction (D1). Therefore, in the first transistor 350B and the second transistor 370B, the direction in which the current flows is parallel or substantially parallel to the first direction.

The direction from one end of the first resistance element 360B toward the other end of the first resistance element 360B and the direction from one end of the second resistance element 380B toward the other end of the second resistance element 380B are parallel or substantially parallel to the first direction (D1). That is, in the first resistance element 360B and the second resistance element 380B, the direction in which the current flows is parallel or substantially parallel to the first direction.

As described above, the arrangement of the first transistor 350B and the second transistor 370B, the arrangement of the first resistance element 360B and the second resistance element 380B, the direction in which current flows in the first transistor 350A and the second transistor 370A, and the direction in which current flows in the first resistance element 360A and the second resistance element 380A are parallel or substantially parallel to the first direction (D1).

As described above, the distance DFpit of the first protection circuit 302 adjacent to each other is longer than the distance DSpit of the second protection circuit 502 adjacent to each other with respect to the direction parallel to or substantially parallel to the first direction (D1). In a direction parallel or substantially parallel to the second direction (D2), the length of the first protection circuit 302 is longer than the length of the second protection circuit 502. That is, the first protection circuit 302 can be widely laid out in the first direction than the second protection circuit 502. Thus, in the arrangement of transistors in the first protection circuit 302, a transistor having a long channel width is divided into a plurality of transistors having a channel width shorter a long channel width. Therefore, in the arrangement of transistors in the first protection circuit 302, the plurality of transistors having a channel width shorter a long channel width can be arranged to fold in a first direction. On the other hand, one the second protection circuit 502 is required for one data line 124, and the space to be laid out in the first direction is smaller than that of the first protection circuit 302. Therefore, the arrangement of the first resistance element 360B and the second resistance element 380B included in the second protection circuit 502 is rotated by 90 degrees or approximately 90 degrees with respect to the arrangement of the first resistance element 360A and the second resistance element 380A included in the first protection circuit 302. In the detection device 10, since the direction in which the transistors and resistance elements are arranged is parallel or substantially parallel to the second direction, the direction of wiring of the transistors and resistance elements can be aligned. As a result, in the detection device 10, the transistor and the resistance elements can be laid out in a narrow space by using a wiring having a narrow width.

<6. Cross-Sectional Structure of the First Protection Circuit 302 and the Second Protection Circuit 502>

Figure 9:
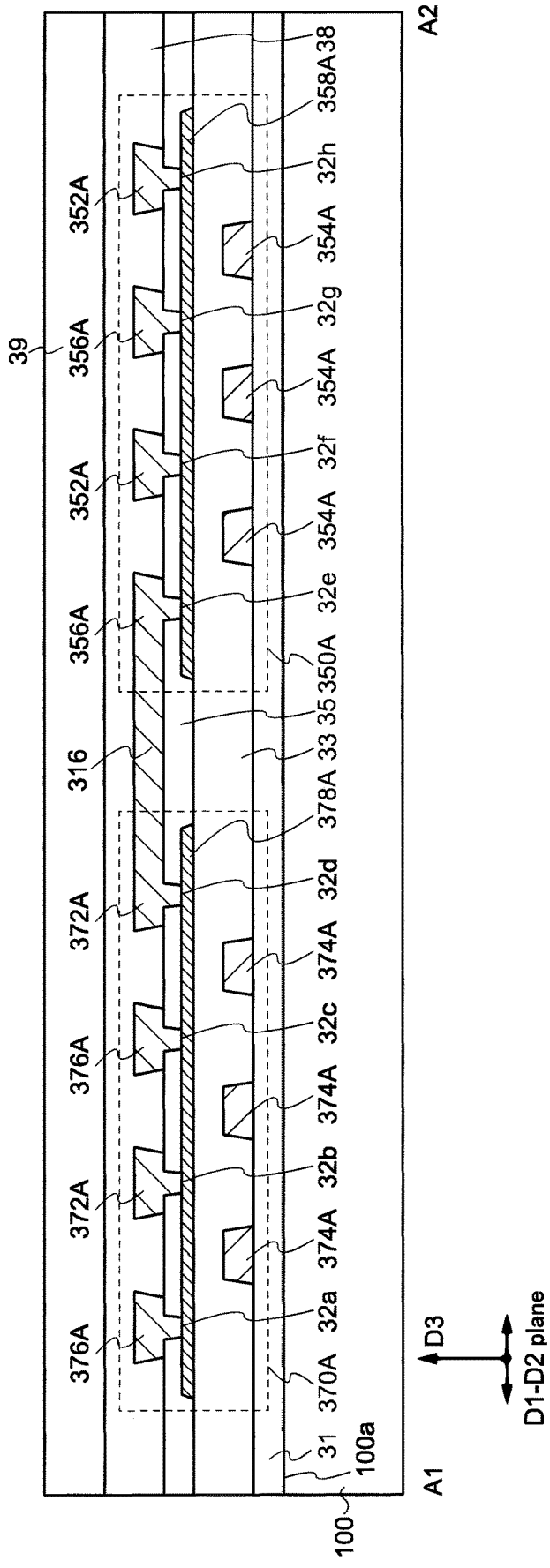
FIG. 9 is a schematic cross sectional view showing a cross section along A1 and A2 of the first protection circuit according to an embodiment.
Figure 10:
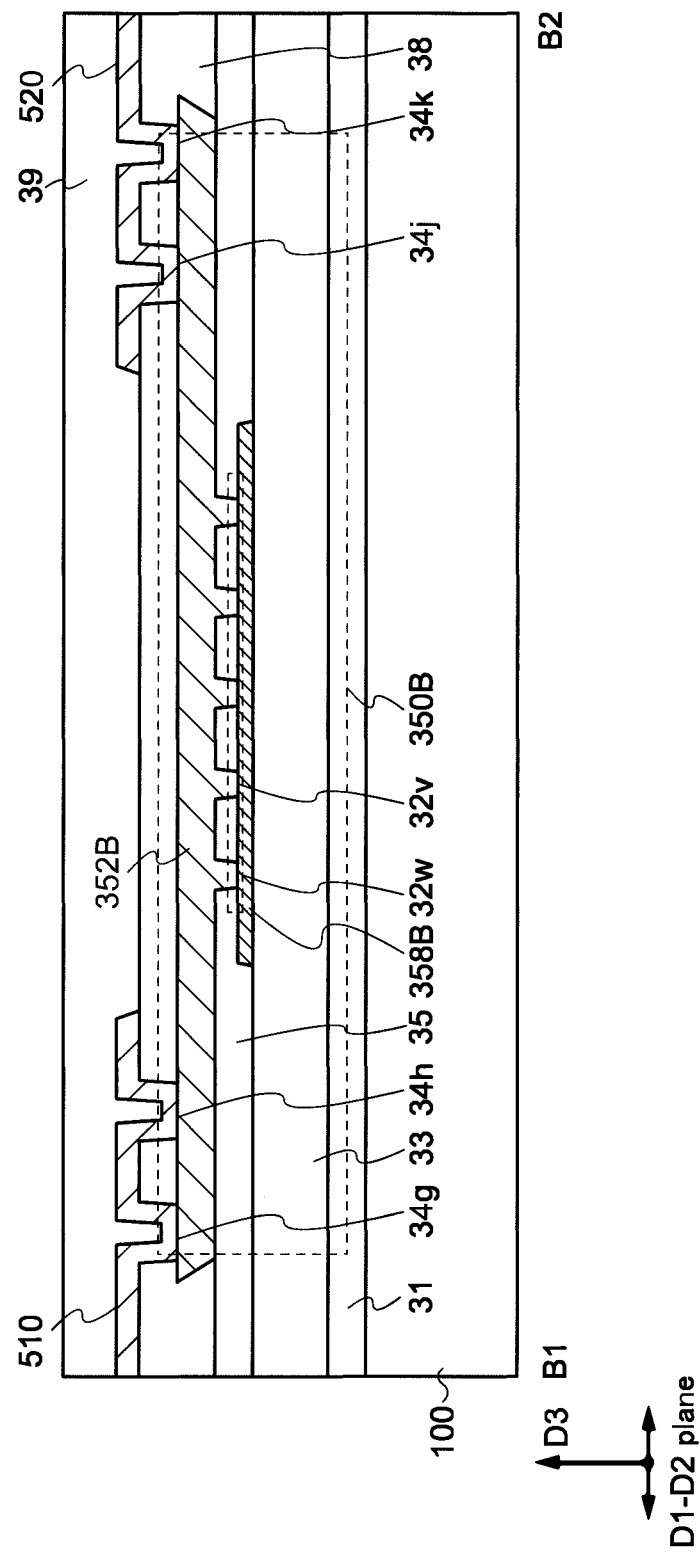
FIG. 10 is a schematic cross sectional view showing a cross section along B1 and B2 of the second protection circuit according to an embodiment.

FIGS. 9 and 10 are cross-sectional view showing an exemplary cross-section of the first protection circuit 302 or the second protection circuit according to an embodiment. The cross-sections of the first protection circuit 302 and the second protection circuit shown in FIGS. 9 and 10 are exemplary, and the cross-sections of the first protection circuit 302 and the second protection circuit 502 are not limited to the cross-sections shown in FIGS. 9 and 10. The same or similar components as those of FIGS. 1 to 8 will be omitted here.

FIG. 9 is a schematic cross-sectional view showing a cross section along A1 and A2 of the first protection circuit according to an embodiment. As shown in FIG. 9, in the cross section along A1 and A2 of the first protective circuit, for example, a first insulating layer 31, a second insulating layer 33, a third insulating layer 35, a fourth insulating layer 38, and a fifth insulating layer 39 are stacked in order from the side closest to the first plane 100a of the first substrate 100. The first insulating layer 31, the second insulating layer 33, the third insulating layer 35, the fourth insulating layer 38 and the fifth insulating layer 39 is formed by using inorganic insulating materials. Inorganic insulating materials are, for example, silicon oxide, silicon nitride or silicon oxynitride. The third insulating layer 35 may be formed using organic insulating materials. Organic insulating materials are, for example, polyimide or acrylic. By using organic insulating material for the third insulating layer 35, the third insulating layer 35 can be filled a surface having convexes formed by a first conductive film including the gate electrode 374A and the gate electrode 354A, the semiconductor layer 378A, the semiconductor layer 358A, the first electrode 372A, the second electrode 376A, the first electrode 352A and the second conductive film including the second electrode 356A. As a result, the third insulating layer 35 can flatten the surface having convexes formed by a first conductive film including the gate electrode 374A and the gate electrode 354A, the semiconductor layer 378A, the semiconductor layer 358A, the first electrode 372A, the second electrode 376A, the first electrode 352A and the second conductive film including the second electrode 356A. In the detection device 10, by planarizing the surface with the third insulating layer 35, it is possible to ensure the flatness of a third conductive film for forming the sensor electrode 121 (FIG. 11) on the third insulating layer 35. Consequently, since the plurality of sensor electrode 121 can be uniformly flat in substrate plane, it is possible to suppress variations in signal detection. Therefore, the detection device 10 according to an embodiment can detect a fingerprint more clearly.

A first insulating layer 31 is a base film. By providing the first insulating layer 31 on the first plane 100a of the first substrate 100, a penetration of impurities or the like from the first substrate 100 into the transistor can be suppressed. The first insulating layer 31 may be omitted. The first conductive film forming the gate electrode 374A and the gate electrode 354A is formed on the first insulating layer 31. A second insulating layer 33 is formed on the first conductive film. The second insulating layer 33 is a gate insulating film. The semiconductor layer 378A and the semiconductor layer 358A are formed on the second insulating layer 33. The semiconductor layer 378A and the semiconductor layer 358A are formed of semiconductor materials such as, for example, amorphous silicon, polycrystalline silicon, or metallic oxides.

A third insulating layer 35 is formed on the semiconductor layer 378A and the semiconductor layer 358A. The contact holes 32a, 32b, 32c, 32d, 32e, 32f, 32g, 32h are formed in the third insulating layer 35. The second conductive film forming the first electrode 372A, the second electrode 376A, the first electrode 352A, and the second electrode 356A is formed on the third insulating layer 35. The first electrode 372A and the second electrode 376A are connected to the semiconductor layer 378A exposed by the contact holes 32a, 32b, 32c, and 32d. The first electrode 352A and the second electrode 356A are connected to the semiconductor layer 358A exposed by contact holes 32e, 32f, 32g, and 32h. The semiconductor layer 378A and 358A are connected via the first electrode 372A and the second electrode 356A. The first conductive film forming the gate electrode 374A, the gate electrode 354A, the first electrode 372A, the second electrode 376A, the first electrode 352A, and the second conductive film forming the second electrode 356A are formed using metallic materials such as aluminium, molybdenum, titanium, tungsten, and the like.

A fourth insulating layer 38 is formed over the second conductive film forming the first electrode 372A, the second electrode 376A, the first electrode 352A, and the second electrode 356A. Further, a fifth insulating layer 39 is formed over the fourth insulating layer 38.

FIG. 10 is a schematic cross-sectional view showing a cross section along B1 and B2 of the second protection circuit according to an embodiment. The same or similar components as those of FIGS. 1 to 9 will be omitted here.

As shown in FIG. 10, a semiconductor layer 358B is formed over the second insulating layer 33. Subsequently, the third insulating layer 35 is formed over the semiconductor layer 358B. The contact hole group 32w including the contact hole 32v is formed in the third insulating layer 35. The second conductive film forming a first electrode 352B is formed over the third insulating layer 35. The first electrode 352B is connected to the semiconductor layer 358B exposed by contact hole group 32w. The fourth insulating layer 38 is formed over the second conductive film forming the first electrode 352B. The contact holes 34g, 34h, 34j, 34k are formed in the fourth insulating layer 38. The third conductive film including an input terminal 510 and an output terminal 520 is connected to the first electrodes 352B exposed by contact holes 34g, 34h, 34j, 34k. In a side view, the input terminal 510 and the output terminal 520 are provided as identical layers on the fourth insulating layer 38. The fifth insulating layer 39 is formed over the third conductive film that includes the input terminal 510 and the output terminal 520.

As described above, the first transistor 350A, the second transistor 370A, the first transistor 350B, and the second transistor 370B are formed.

The first resistance element 360A, the second 380A, the first resistance element 360B and the second resistance element 380B is formed, similarly to the first transistor 350A, the second transistor 370A, the first transistor 350B and the second transistor 370B.

<7. Cross-Sectional Structure of a Sensor 120>

Figure 11:
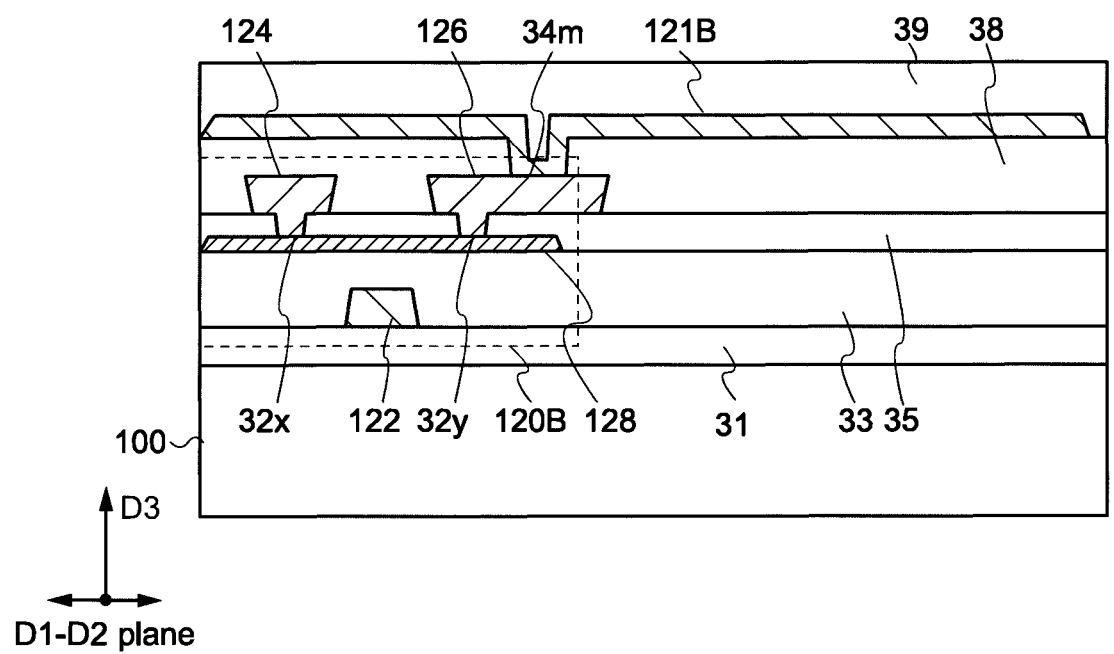
FIG. 11 is a schematic cross sectional view showing a cross section of the sensor according to an embodiment.

FIG. 11 is a cross-sectional view showing an exemplary cross-section of the sensor 120 according to an embodiment. The cross-section of the sensor 120 shown in FIG. 11 is one example, and the cross-section of the sensor 120 is not limited to the cross-section shown in FIG. 11. The description of same or similar components as those of FIGS. 1 to 10 will be omitted here.

As shown in FIG. 11, the first insulating layer 31 is formed on the first plane 100a of the first substrate 100. The first conductive film forming the gate line 122 is formed on the first insulating layer 31. The second insulating layer 33 is formed on the first conductive film. A semiconductor layer 128 is formed on the second insulating layer 33. Subsequently, the third insulating layer 35 is formed on the semiconductor layer 128. The contact holes 32x, 32y are formed in the third insulating layer 35. The second conductive film forming the data line 124 and an electrode 126 is formed on the third insulating layer 35. The data line 124 and the electrode 126 are connected to the semiconductor layer 128 exposed by the contact holes 32x, 32y. The fourth insulating layer 38 is then formed on the data line 124 and the second conductive film forming the electrode 126. Subsequently, a contact hole 34m is formed in the fourth insulating layer 38. The third conductive film forming a sensor electrode 121B is connected to the electrode 126 exposed by the contact hole 32m. Further, the fifth insulating layer 39 is formed on the sensor electrode 121B. In a side view, the sensor electrode 121B is provided as identical layers on the fourth insulating layer 38, like the input terminal 310, the output terminal 320, the input terminal 510 and the output 520. The third conductive film for forming the sensor electrode 121B is formed using a metallic material such as aluminum, for example.

As described above, the sensor 120 is formed.

<8. Cross-Sectional Structure of the Sensor 120>

Figure 12:
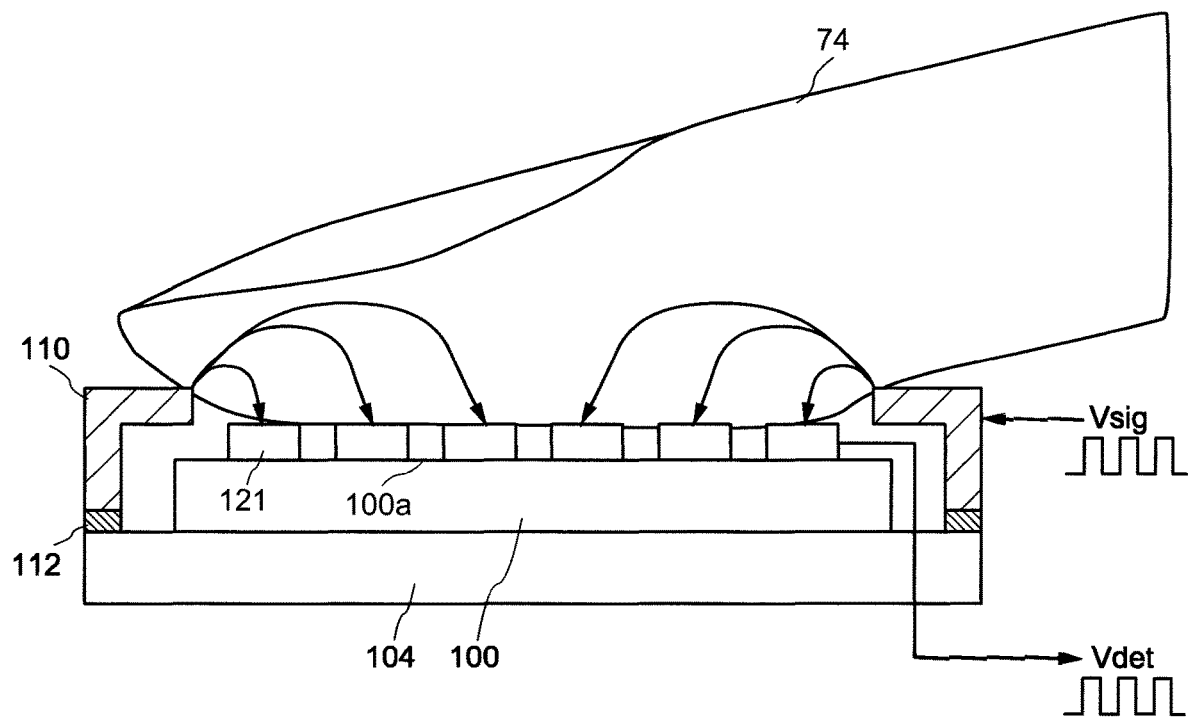
FIG. 12 is a diagram showing an exemplary case in which a square wave propagates from a transmission conductor according to an embodiment to a sensor electrode through a finger.

FIG. 12 is a diagram showing an exemplary rectangular wave propagates from the transmission conductor 110 according to an embodiment to the sensor electrode 121 via a finger 74. FIG. 12 is showing the detection device 10 according to an embodiment is a schematically diagram showing an example of a rectangular wave propagates. For convenience of explanation, in FIG. 12, various insulating film and various conductive film between the first plane 100a of the first substrate 100 and the sensor electrode 121, the second substrate 103 between the first substrate 100 and the third substrate 104, each wiring, the IC107, and the like are omitted. Also, description of the same or similar components as those of FIGS. 1 to 11 will be omitted here.

As described above, in the fingerprint sensor according to an embodiment, the transmission conductor 110 serves as a transmitting electrode (Tx electrode), the sensor electrode 121 serves as a receiving electrode (Rx electrode).

For example, as shown in FIG. 2, the IC 107 supplies driving signal Vsig to the transmission conductor 110 via the wiring 108. The gate driver 102 selects, for example, the one gate line 122 among a plurality of gate lines based on a control signal supplied from the IC 107 via the wiring 116, the terminal part 200 and the first protection circuit unit 300. Subsequently, the gate driver 102 applies a predetermined voltage to the selected gate line.

As shown in FIGS. 2 and 4, the sensor electrode 121 of the sensor 120 connected to the selected gate line is connected to the selection circuit 402 via the data line 124 and the transistor. The selection circuit 402 selects the plurality of data lines including the data line 124 from among a plurality of data lines based on control signal supplied from the IC 107. The selection circuit 402 connects a plurality of data lines including the selected data line 124 to the IC 107 via the second protection circuit 502, the selection circuit 402, the first protection circuit 302, the terminal 202, the wiring 114 and the wiring 116 or the like.

As shown in FIG. 12, the magnetic field between the transmission conductor 110 and the sensor electrode 121 changes when the finger 74 approaches or contacts the detection device 10. The sensor electrode 121 detects (input) the change of a driving signal Vsig based on the changed magnetic field, and transmits (output) a detection signal Vdet to the IC 107 via the data line 124. The detection signal Vdet includes the change detected in the driving signal Vsig. The IC 107 can detect fingerprints by receiving the detection signal and analyzing detection signal Vdet.

Each embodiment or a part of each embodiment described above as one embodiment of the present disclosure can be implemented in combination as appropriate if they do not conflict with each other.

In addition, within the scope of the idea of the present invention, a person skilled in the art can correspond to various modifications and amendments, and it is understood that these modifications and modifications also belong to the scope of the present invention. For example, those skilled in the art could appropriately add, delete, or change the design of the constituent elements based on the each embodiment, or add, omit, or change the conditions as long as it does not depart from the concept of the present invention and such changes are included within the scope of the present invention.

What is claimed is:

1. A detection device comprising:
   a substrate;
   a terminal part provided on the substrate and having a plurality of terminals;
   a first protection circuit unit provided on the substrate and having a plurality of first protection circuits;
   a selector unit provided on the substrate and having a plurality of selectors;
   a second protection circuit unit provided on the substrate and having a plurality of second protection circuits; and
   a sensor unit provided on the substrate and having a plurality of sensors;
   wherein
   the first protection circuit unit is provided between the terminal part and the selector unit,
   the second protection circuit unit is provided between selector unit and the sensor unit,
   the sensor unit includes a plurality of the sensors,
   the plurality of sensors are arranged in a first direction and a second direction intersecting the first direction,
   the plurality of first protection circuits and the plurality of second protection circuits are arranged in a direction parallel to the first direction, and the distance between the first protection circuits adjacent to each other is longer than the distance between the second protection circuits adjacent to each other.

2. The detection device according to claim 1, wherein the first protection circuit has a first rectifying element, a second rectifying element, and a first resistance element.

3. The detection device according to claim 2, wherein the second protection circuit has a third rectifying element, a fourth rectifying element, and a second resistance element.

4. The detection device according to claim 3, wherein the first rectifying element has a diode-connected first transistor,
the second rectifying element has a diode-connected second transistor,
the third rectifying element has a diode-connected third transistor,
the fourth rectifying element has a diode-connected fourth transistor,
a channel width of the first transistor is the same as a channel width of the second transistor,
a channel width of the third transistor is the same as a channel width of the fourth transistor, and
the channel width of the first transistor and the channel width of the second transistor are longer than the channel width of the third transistor and the channel width of the fourth transistor.

5. The detection device according to claim 4, wherein a resistance value of the first resistance element is the same as a resistance value of the second resistance element.

6. The detection device according to claim 3, wherein the first resistance element is provided substantially parallel to the first direction, and
the second resistance element is provided substantially parallel to the second direction.

7. The detection device according to claim 1, wherein the first protection circuit has an input terminal connected to the terminal and an output terminal electrically connected to the selector, and
the input terminal and the output terminal are provided on an insulating layer.

8. The detection device according to claim 1, wherein the second protection circuit has an input terminal connected to the selector and an output terminal electrically connected to the sensor,
the sensor has a sensor electrode for detecting a signal, and
the input terminal, the output terminal, and the sensor electrode are provided on an insulating layer.

9. The detection device according to claim 1, wherein the substrate includes an insulating material.

10. A detection device comprising:
a substrate;
a terminal part provided on the substrate and having a plurality of terminals;
a first protection circuit unit provided on the substrate and having a plurality of first protection circuits;
a selector unit provided on the substrate and having a plurality of selectors;
a second protection circuit unit provided on the substrate and having a plurality of second protection circuits; and
a sensor unit provided on the substrate and having a plurality of sensors;
wherein
the first protection circuit unit is provided between the terminal part and the selector unit,
the second protection circuit unit is provided between selector unit and the sensor unit,
the sensor unit includes a plurality of the sensors,
the terminal is connected to the first protection circuit,
the first protection circuit is connected to two or more of selectors,
the selector is connected to the second protection circuit, and
the second protection circuit is connected to a plurality of the sensors arranged in the second direction.

11. The detection device according to claim 10, wherein the sensor unit includes a plurality of the sensors,
the plurality of sensors are arranged in a first direction and a second direction intersecting the first direction,
the plurality of first protection circuits and the plurality of second protection circuits are arranged in a direction parallel to the first direction, and
the distance between the first protection circuits adjacent to each other is longer than the distance between the second protection circuits adjacent to each other.

12. The detection device according to claim 11, wherein the first protection circuit has a first rectifying element, a second rectifying element, and a first resistance element.

13. The detection device according to claim 12, wherein the second protection circuit has a third rectifying element, a fourth rectifying element, and a second resistance element.

14. The detection device according to claim 13, wherein the first rectifying element has a diode-connected first transistor,
the second rectifying element has a diode-connected second transistor,
the third rectifying element has a diode-connected third transistor,
the fourth rectifying element has a diode-connected fourth transistor,
a channel width of the first transistor is the same as a channel width of the second transistor,
a channel width of the third transistor is the same as a channel width of the fourth transistor, and
the channel width of the first transistor and the channel width of the second transistor are longer than the channel width of the third transistor and the channel width of the fourth transistor.

15. The detection device according to claim 14, wherein a resistance value of the first resistance element is the same as a resistance value of the second resistance element.

16. The detection device according to claim 13, wherein the first resistance element is provided substantially parallel to the first direction, and
the second resistance element is provided substantially parallel to the second direction.

17. A detection device comprising:
a substrate;
a terminal part provided on the substrate and having a plurality of terminals;
a first protection circuit unit provided on the substrate and having a plurality of first protection circuits;
a selector unit provided on the substrate and having a plurality of selectors;
a second protection circuit unit provided on the substrate and having a plurality of second protection circuits; and a sensor unit provided on the substrate and having a plurality of sensors;

wherein the first protection circuit unit is provided between the terminal part and the selector unit, the second protection circuit unit is provided between selector unit and the sensor unit, and a capacitance value of the second protection circuit is smaller than a capacitance value of the first protection circuit.

18. The detection device according to claim 17, wherein the sensor unit includes a plurality of the sensors, the plurality of sensors are arranged in a first direction and a second direction intersecting the first direction, the plurality of first protection circuits and the plurality of second protection circuits are arranged in a direction parallel to the first direction, and the distance between the first protection circuits adjacent to each other is longer than the distance between the second protection circuits adjacent to each other.

19. The detection device according to claim 18, wherein the first protection circuit has a first rectifying element, a second rectifying element, and a first resistance element.

20. The detection device according to claim 19, wherein the second protection circuit has a third rectifying element, a fourth rectifying element, and a second resistance element.

* * * * *